(12) United States Patent
Takita et al.

(10) Patent No.: US 10,161,990 B2
(45) Date of Patent: Dec. 25, 2018

(54) INSPECTION SYSTEM FOR DEVICE TO BE TESTED, AND METHOD FOR OPERATING INSPECTION SYSTEM FOR DEVICE TO BE TESTED

(71) Applicant: SINTOKOGIO, LTD., Nagoya-shi, Aichi (JP)

(72) Inventors: Nobuyuki Takita, Ama-gun (JP); Takayuki Hamada, Ama-gun (JP); Yoichi Sakamoto, Ama-gun (JP); Syuji Ishikawa, Ama-gun (JP)

(73) Assignee: SINTOKOGIO, LTD., Nagoya-shi, Aichi (JP)

( * ) Notice: Subject to any disclaimer, the term of this patent is extended or adjusted under 35 U.S.C. 154(b) by 0 days.

(21) Appl. No.: 15/124,439

(22) PCT Filed: Feb. 5, 2015

(86) PCT No.: PCT/JP2015/053260
§ 371 (c)(1),
(2) Date: Sep. 8, 2016

(87) PCT Pub. No.: WO2015/137023
PCT Pub. Date: Sep. 17, 2015

(65) Prior Publication Data
US 2017/0023636 A1    Jan. 26, 2017

(30) Foreign Application Priority Data

Mar. 11, 2014 (JP) .................................. 2014-047040

(51) Int. Cl.
*G01R 31/27* (2006.01)
*G01R 31/26* (2014.01)
(Continued)

(52) U.S. Cl.
CPC ......... *G01R 31/275* (2013.01); *G01R 1/0408* (2013.01); *G01R 31/26* (2013.01);
(Continued)

(58) Field of Classification Search
CPC ................ G01R 31/26; G01R 31/2601; G01R 31/2608; G01R 31/261; G01R 31/2617;
(Continued)

(56) References Cited

U.S. PATENT DOCUMENTS

| 7,701,241 B2* | 4/2010 | Kumagai | G01R 31/2889 324/750.3 |
| 2012/0081139 A1* | 4/2012 | Yoshida | G01R 31/2608 324/750.16 |

(Continued)

FOREIGN PATENT DOCUMENTS

| CN | 1670587 | 9/2005 |
| CN | 1853320 | 10/2006 |

(Continued)

OTHER PUBLICATIONS

International Preliminary Report on Patentability dated Sep. 22, 2016 for PCT/JP2015/053260.

*Primary Examiner* — Walter L Lindsay, Jr.
*Assistant Examiner* — Milton Gonzalez
(74) *Attorney, Agent, or Firm* — Drinker Biddle & Reath LLP

(57) ABSTRACT

In an inspection system for a device to be tested, a stage, on which a device to be tested and a diode are loaded, is moved to a static characteristic test station and a dynamic characteristic test station. A method for operating an inspection system for a device to be tested includes a process of carrying in and loading the stage, on which the device to be tested and the diode are loaded, a process of carrying in and fixing the device to be tested to a test station, a process of
(Continued)

bringing a probe into contact with the diode, a process of switching a position of the diode, a process of performing a measurement with respect to the device to be tested, a process of carrying out the device to be tested from the stage, and a process of classifying the device to be tested.

18 Claims, 16 Drawing Sheets

(51) Int. Cl.
G01R 1/04 (2006.01)
G01R 31/28 (2006.01)
(52) U.S. Cl.
CPC ..... *G01R 31/2601* (2013.01); *G01R 31/2891* (2013.01); *G01R 31/2893* (2013.01)
(58) Field of Classification Search
CPC ............ G01R 31/2632; G01R 31/2633; G01R 31/275
See application file for complete search history.

(56) References Cited

U.S. PATENT DOCUMENTS

| | | | | |
|---|---|---|---|---|
| 2013/0063171 A1* | 3/2013 | Kouno | ............... | G01R 31/2886 324/750.25 |
| 2013/0082727 A1* | 4/2013 | Matsumura | ........ | G01R 31/2887 324/750.16 |
| 2013/0141127 A1* | 6/2013 | Yasuta | ................... | G01R 1/067 324/750.03 |
| 2014/0176173 A1* | 6/2014 | Shinohara | .......... | G01R 31/2601 324/754.07 |
| 2014/0247037 A1* | 9/2014 | Shinohara | ............ | G01R 1/0491 324/149 |
| 2015/0015285 A1* | 1/2015 | Shinohara | ............ | G01R 1/0491 324/750.19 |

FOREIGN PATENT DOCUMENTS

| | | |
|---|---|---|
| CN | 102466787 | 5/2012 |
| CN | 102713650 | 10/2012 |
| CN | 103392082 | 11/2013 |
| CN | 103528513 | 1/2014 |
| JP | S62-52941 A | 3/1987 |
| JP | H01-116452 A | 5/1989 |
| JP | H02-75729 U | 6/1990 |
| JP | H08-55885 A | 2/1996 |
| JP | 2001-230481 A | 8/2001 |
| JP | 2007-033042 A | 2/2007 |
| JP | 2012-078174 A | 4/2012 |
| JP | 2013-505583 A | 2/2013 |
| JP | 2013-057589 | 3/2013 |
| TW | 200805852 | 1/2008 |
| TW | 201202720 | 1/2012 |
| TW | 201339596 | 10/2013 |
| WO | WO-2011/034803 A2 | 3/2011 |

\* cited by examiner

DDS

INSPECTION SYSTEM FOR DEVICE TO BE TESTED, AND METHOD FOR OPERATING INSPECTION SYSTEM FOR DEVICE TO BE TESTED

TECHNICAL FIELD

Aspects and embodiments of the invention relate to an inspection system for a device to be tested, and particularly, to an inspection system that carries out inspection for static characteristics and dynamic characteristics during inspection for device characteristics in bear chips such as an insulated gate bipolar transistor (IGBT) and a field effect transistor (FET), and a method for operating the inspection system.

BACKGROUND ART

In the related art, there is known a semiconductor test equipment that sequentially carries out an alternating current (AC) test, a direct current (DC) test, and a thermal resistance test for electrical characteristic inspection of a semiconductor module. A semiconductor test equipment, which is described in Patent Literature 1, includes a retention unit that fixes a device to be tested (hereinafter, also referred to as "device under test (DUT)") to a predetermined position, a plurality of test units that output a test signal to the DUT to perform a test, and a connection unit that electrically connects one of the plurality of test units and a predetermined electrode of the DUT that is fixed by the retention unit to each other. In the semiconductor test equipment, plural kinds of tests are carried out by sequentially connecting plurality of test units to the DUT.

In the semiconductor test equipment described in Patent Literature 1, the test units, which are connected to the DUT, are switched by the above-described connection unit. Accordingly, in the semiconductor test equipment, a configuration in accordance with connection to the test units becomes simple, and thus it is possible to reduce the facility cost.

CITATION LIST

Patent Literature

[Patent Literature 1] Japanese Unexamined Patent Publication No. 2012-78174

SUMMARY OF INVENTION

Technical Problem

Here, in the DUT such as a bear chip, there is a possibility that problems relating to breakage of a device and the like may be caused. Accordingly, for example, in an in-vehicle product, a total inspection is principally carried out for the bear chip. As described above, it is necessary to perform inspection with respect to a plurality of the DUTs, and it is required to perform the inspection with respect to the DUTs with more accuracy. However, in the semiconductor test equipment described in Patent Literature 1, accuracy of the inspection with respect to the DUTs is not sufficient.

For example, FIG. 13 illustrates a state in which a DUT 104 is loaded on a stage 102 in a DUT inspection system of the related art. In an example illustrated in FIG. 13, a diode that measures characteristics of the DUT 104 is embedded in a test circuit that is provided to a test station.

However, in a case where the diode is embedded in the test circuit, the diode is disposed at a position spaced away from the DUT, and thus an interconnection that connects the diode and the DUT is lengthened. In addition, in a case where the diode is embedded in the test circuit, a disconnection unit is necessary when connecting the DUT to another test circuit. As described above, the interconnection that connects the diode and the DUT is long, and a component such as the disconnection unit is interposed between the diode and the DUT, and thus inductance is great. Accordingly, there is room for improvement in accuracy of the inspection with respect to the DUI Various aspects of the invention are made to solve the above-described problem, and an object thereof is to perform inspection for device characteristics with accuracy in an inspection system for a device to be tested.

Solution to Problem

According to an aspect of the invention, there is provided an inspection system for a device to be tested. The inspection system includes a diode that is loaded in parallel to the device to be tested, and is capable of being connected to a test circuit, a stage on which the device to be tested and the diode are loaded, and a movement mechanism that moves the stage to a static characteristic test station including a first test circuit that measures static characteristics of the device to be tested, and a dynamic characteristic test station including a second test circuit that measures dynamic characteristics of the device to be tested.

According to the aspect of the invention, the device to be tested is loaded on the stage in combination with the diode, and in this state, the stage is moved to the static characteristic test station and the dynamic characteristic station. Accordingly, it is possible to dispose the diode at a position that is closer to the device to be tested in comparison to the related art, and thus it is possible to shorten an interconnection that connects the diode and the device to be tested. In addition, the diode and the device to be tested are disposed on the stage, and thus a disconnection unit may be unnecessary when connecting the diode to another test circuit. Accordingly, it is possible to shorten the interconnection that connects the diode and the device to be tested, and the disconnection unit may be unnecessary, and thus it is possible to reduce inductance. As a result, it is possible to perform inspection with respect to the device to be tested with accuracy.

In an embodiment, the inspection system may further include an elevating mechanism that moves up and down the diode with respect to the stage, and the diode may be capable of being connected to or separated from the first test circuit and the second test circuit by the elevating mechanism. As described above, the diode is capable of being connected to or separated from the first test circuit and the second test circuit by the elevating mechanism, it is possible to easily perform connection of the diode to the first test circuit and the second test circuit. In addition, when the diode is connected to the second test circuit by using the elevating mechanism, the device to be tested is connected to the second test circuit through the diode. Accordingly, a route of a current is secured in the second test circuit, and thus it is possible to measure switching characteristics of the device to be tested.

In an embodiment, the stage, on which the device to be tested and the diode are loaded, may connect the diode to the first test circuit by pushing up the diode to come into contact with a probe, which is provided to the first test circuit, in the static characteristic test station.

In an embodiment, the stage, on which the device to be tested and the diode are loaded, may separate the diode from the first test circuit by lowering the diode to be separated from a probe, which is provided to the first test circuit, in the static characteristic test station.

In an embodiment, the stage, on which the device to be tested and the diode are loaded, may be provided with a separation mechanism that separates the diode from the first test circuit by lowering the diode to be separated from the probe in the static characteristic test station, and the separation mechanism may include an elevating mechanism that is connected to a lower portion of the diode loading stage, and a flexible cable that electrically connects the diode and the device to be tested. As described above, it is possible to flexibly perform movement of the diode by using the flexible cable that electrically connects the diode and the device to be tested. Accordingly, it is possible to perform switching of the test circuits in a simple manner.

In an embodiment, the stage, on which the device to be tested and the diode are loaded, may be provided with a connection and separation mechanism that connects or separates the diode to or from the first test circuit in accordance with whether or not the probe and the diode come into contact with each other in the static characteristic test station, and the connection and separation mechanism may include an elevating mechanism that is connected to a lower portion of the diode loading stage, and a flexible cable that electrically connects the diode and the device to be tested. When the flexible cable is provided, it is possible to perform switching of the test circuit in a simple manner.

In an embodiment, the stage, on which the device to be tested and the diode are loaded, may separate the diode from the second test circuit by lowering the diode to be separated from a probe, which is provided to the second test circuit, in the dynamic characteristic test station. According to this configuration, it is possible to perform switching of the test circuit in a simple manner in the dynamic characteristic test station. In addition, the diode is lowered to be separated from the probe that is provided to the second test circuit, and thus the device to be tested is not connected to the second test circuit through the diode. Accordingly, there is no route through which energy is applied to the second test circuit, and thus energy is applied to the device to be tested. As a result, it is possible to measure avalanche characteristics of the device to be tested.

In an embodiment, a probe, a probe holder, a dynamic characteristic test circuit, and a dynamic characteristic test unit which are provided to the second test circuit may be connected to each other in the dynamic characteristic test station. According to this configuration, it is possible to simplify a configuration of the dynamic characteristic test station.

In an embodiment, the movement mechanism may move the stage, on which the device to be tested and the diode are loaded, to a transfer station that transfers the device to be tested. According to this configuration, it is possible to transfer the device to be tested in a simple and efficient manner.

In an embodiment, the stage, on which the device to be tested and the diode are loaded, may be moved to the static characteristic test station, the dynamic characteristic test station, and the transfer station in this order. According to this configuration, it is possible to perform carrying-in, inspection, and carrying-out of the device to be tested in an efficient manner.

In an embodiment, the stage, on which the device to be tested and the diode are loaded, may be provided with a suction and fixing unit that suctions and fixes the device to be tested to the stage.

In an embodiment, the stage, on which the device to be tested and the diode are loaded, may be provided with a suction and fixing unit that suctions and fixes the device to be tested to the stage, and a positioning unit that performs alignment of the device to be tested by using an image processing apparatus, and a probe may come into contact with an electrode of the device to be tested.

In an embodiment, the stage, on which the device to be tested and the diode are loaded, may be provided with a suction and fixing unit having a suction hole for suction and fixing of the device to be tested to the stage, and a positioning unit that positions the device to be tested to a predetermined position by using an insulating guide structure, and a probe may come into contact with an electrode of the device to be tested.

In an embodiment, the stage, on which the device to be tested and the diode are loaded, may be provided with a positioning unit having a processed groove in which the device to be tested is fixed, and a probe may come into contact with an electrode of the device to be tested.

In an embodiment, the movement mechanism may move the stage, on which the device to be tested and the diode are loaded, while controlling the stage in XYZθ directions so as to bring the probe into contact with a predetermined electrode of the device to be tested.

In an embodiment, the probe, the probe holder, the dynamic characteristic test circuit, and the dynamic characteristic test unit may be connected to each other in the dynamic characteristic test station, and the probe holder may have a parallel flat plate structure in which a P electrode and an N electrode are stacked. According to this configuration, it is possible to minimize an interconnection, and thus inductance is reduced. As a result, it is possible to realize inspection with high accuracy.

According to another aspect of the invention, there is provided a method for operating an inspection system for a device to be tested. The method is used in an inspection system for the device to be tested in which a stage, on which a device to be tested and a diode are loaded, is moved to a static characteristic test station and a dynamic characteristic test station. The method includes a process of carrying in and loading the stage, on which the device to be tested and the diode are loaded, a process of carrying in and fixing the device to be tested to a test station, a process of bringing a probe into contact with the diode, a process of switching a position of the diode, a process of performing a measurement with respect to the device to be tested, a process of carrying out the device to be tested from the stage, and a process of classifying the device to be tested. According to the aspect of the invention, it is possible to realize inspection with high accuracy.

In an embodiment, in the process of bringing the probe into contact with the diode, the device to be tested may be suctioned and fixed to the stage by using a suction hole, and alignment may be performed by an image processing apparatus in order for the probe to come into contact with an electrode of the device to be tested.

Advantageous Effects of Invention

According to various aspects of the invention, it is possible to inspect device characteristics with accuracy.

DESCRIPTION OF EMBODIMENTS

Figure 1:
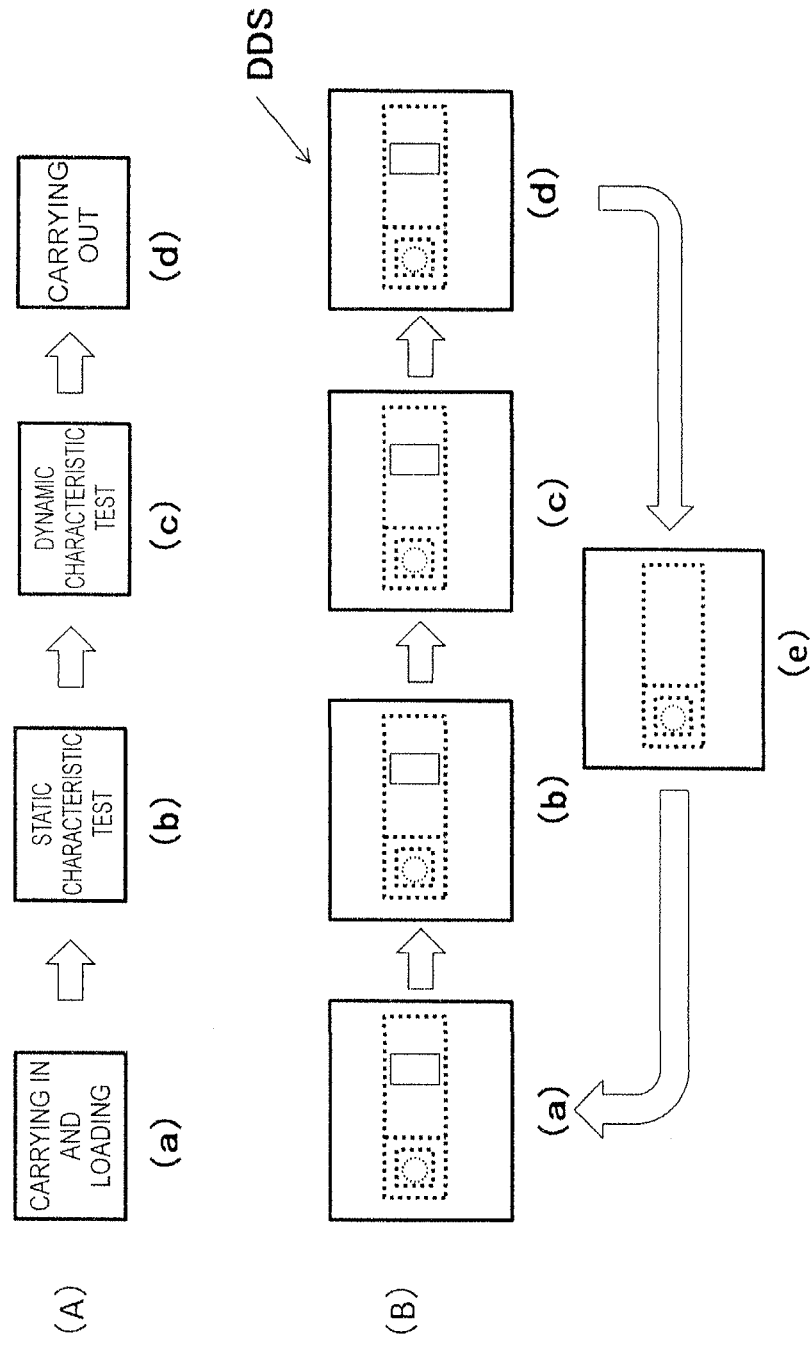
FIG. 1 is an example of a block diagram illustrating a straight advancing type system configuration of a bear chip inspection system according to an embodiment.

In this example, description will be given of a bear chip inspection system as an example of an inspection system for a device to be tested according to an aspect of the invention. In the bear chip inspection system of this embodiment, a stage on which a DUT and a diode are loaded moves to a static characteristic test station and a dynamic characteristic test station.

Here, in this embodiment, the bear chip represents a semiconductor chip that is mounted in a substrate in a chip state. In addition, in this embodiment, the inspection system represents the entirety of a device that carries out inspection for characteristics of the DUT. In addition, in this embodiment, the "stage on which the DUT and the diode are loaded" (hereinafter, also referred to as DDS) is a state on which the DUT and the diode are loaded, and is a movable member. In addition, "facing" represents a state in which two objects are disposed to face each other. Specifically, for example, the DUT and the diode are loaded in parallel when seen from an upper side, but the direction of the DUT and the diode is not fixed. However, two chips are disposed to be adjacent to each other. In addition, as described later, the DUT and the diode may be transported in a pair. However, during inspection, the DUT and the diode may be used in a pair or may not be used in a pair. In addition, with regard to the DUT, the diode, and the stage on which the DUT and the diode are loaded, the shape, the size, and the arrangement thereof may be appropriately changed in accordance with the kind of the DUT.

The static characteristic (DC) test station represents a station in which static characteristics and thermal resistance of the DUT are measured, and hereinafter, may be simply referred to as "static characteristic test station". In a static characteristic test, static characteristics such as a leakage current and an on-voltage of the DUT are measured. Here, in the static characteristic test, a DC parameter characteristic test, or a characteristic name that constitutes static characteristics is used. For example, the static characteristic test may be referred to as a breakdown voltage test, a leakage current test, a forward voltage test, a gate threshold voltage test, and the like. A thermal resistance test is a test for measuring heat radiation characteristics of the DUT.

The dynamic characteristic (AC) test station represents a station in which dynamic characteristics of the DUT are measured, and hereinafter, may be simply referred to as "dynamic characteristic test station". The dynamic characteristic is a test for measuring switching characteristics and the like, which are represented by fall time during a switching operation or inverse recovery time of an embedded freewheeling diode (FWD), and the like, and for assuring the quality thereof. The dynamic characteristic test may be called a test name for measuring an individual dynamic characteristic. Examples of the test name include names such as a switching characteristic test, a load short-circuit test, a short circuit safe operation area (SCSOA) test, a reverse bias safe operation area (RBSOA) test, an avalanche test, and a reverse recovery characteristic test.

"Movement" represents that the stage, on which the DUT and the diode are loaded, is moved to the subsequent test station. "Movement mechanism" represents a unit that moves the stage on which the DUT and the diode are loaded, and examples of the "movement mechanism" include an apparatus that moves the stage by using a cylinder, and an apparatus that moves the stage by using a ball screw mechanism. However, the "movement mechanism" may be a mechanism capable of moving the stage to a plurality of test stations, and a direction in which the stage is moved by the "movement mechanism" and means for moving the stage by the "movement mechanism" are not particularly limited. As the "movement mechanism", for example, a rotary type movement mechanism that rotates and moves the stage, or a straight advancing type movement mechanism that allows the stage to advance straight may be used. Here, on the stage, the diode is disposed at a position immediately close to the DUT to reduce inductance. In addition, the diode may be disposed to be vertically reversed for matching of the polarity.

"Capable of being connected to or separated from" represents that it is possible to select a state in which the stage on which the DUT and the diode are loaded, and the probe card come into contact with each other (are connected to each other), and a state in which the stage and the probe card do not come into contact with each other (are not connected to each other).

"Comes into contact with a probe that is provided to the first test circuit (second test circuit)" represents that the diode comes into contact with the probe and thus connection of an electrical circuit is established. "Pushing up the diode" represents that the diode is mechanically moved to an upper side, that is, a side at which the diode comes into contact with the probe by using an electromagnetic solenoid and the like. "Diode is separated from the probe that is provided to the first test circuit (second test circuit)" represents that the diode does not come into contact with the probe, and connection of the electrical circuit is not established. "Lowering the diode" represents that the diode is mechanically moved to a lower side, that is, a side at which the diode is separated from the probe by using an electromagnetic solenoid and the like. "Diode is separated from the first test circuit (second test circuit)" represents that the diode is electrically separated from each of the test circuits. "Connection and separation mechanism that connects or separates the diode to or from the first test circuit (second test circuit)" represents a mechanism that realizes a state in which the diode is present or absent in each of the test circuits.

Examples of the "elevating mechanism that is connected to a lower portion of the diode loading stage" include a pneumatic cylinder or a solenoid, but a driving source of the elevating mechanism does not matter. "a probe, a probe holder, a dynamic characteristic test circuit, and a dynamic characteristic test unit which are provided to the second test circuit are connected to each other in the dynamic characteristic test station" represents a state in which electrical connection is established, and thus measurement can be performed. "Moved to the transfer station" represents that the stage, on which the DUT and the diode are loaded, is moved to the transfer station. "Moved to the static characteristic test station, the dynamic characteristic test station, and the transfer station in this order" includes a series of operations of measuring the static characteristics of the DUT at the static characteristic test station, measuring the dynamic characteristics of the DUT at the dynamic characteristic test station, and transferring the DUT with the transfer station, and may include operations of moving the stage on which the DUT and the diode are loaded, and sequentially performing inspection. In this case, in the static characteristic test station, only movement of the stage on which the DUT and the diode are loaded, and measurement of the dynamic characteristic are repetitively performed. In the dynamic characteristic test station, only movement of the stage on which the DUT and the diode are loaded, and measurement of the dynamic characteristics are repetitively performed. Similarly, in the transfer station, only transferring of the DUT is repetitively performed.

"stage on which the DUT and the diode are loaded is provided with a suction and fixing unit that suctions and fixes the DUT" represents that a unit that suctions and fixes the DUT is provided, for example, by forming a hole in a lateral surface of an electrode block on which the DUT is loaded, and allowing the hole to communicate with an upper surface of the electrode block, on which the DUT is placed, to suction and fix the DUT.

In addition, the stage on which the diode is loaded may include a "positioning unit that performs alignment of the DUT by using an image processing apparatus". For example, the "image processing apparatus" is an apparatus which is provided with a CCD camera that captures an image of the DUT, and which calculates a position of the DUT by processing the image that is captured by the CCD camera. The position of the DUT can be accurately calculated by the "image processing apparatus". The alignment represents control of moving DDS in XYZθ directions so as to bring the probe into contact with a predetermined electrode of the DUT. In addition, "probe comes into contact with an electrode of the DUT" includes a state in which the probe is connected to a circuit that is formed inside the DUT, and a state in which the probe is connected to a plurality of electrodes which lead out to a surface of the DUT and have functions different from each other. In a case of IGBT, for example, the connection represents that the probe is brought into contact with a collector, a gate, and an emitter. According to this configuration, there is an advantage that accuracy of a position at which the DUT is placed may be low. The reason for this is that fine adjustment is made through alignment.

Examples of the "positioning unit" include a unit that performs suctioning and fixing to a predetermined position by using an insulating guide structure. For example, the insulating guide structure represents a guide that is provided on a replaceable DUT plate, and has a structure in which the position of the DUT on the DUT plate is determined. In addition, the "positioning unit" may be configured as a positioning unit which is provided with a processed groove in which the DUT is fixed, and in which the DUT is suctioned and fixed by using the processed groove. On the other hand, as means for "moving the stage while controlling the stage in XYZθ directions", it is possible to employ a configuration in which orthogonal robots are combined. For example, as the unit that moves the stage while controlling the stage in XYZθ directions, a four-axis drive stage may be used.

"Probe holder has a parallel flat plate structure" represents that the probe holder includes parallel flat plate electrodes which are disposed in parallel and to be close to each other through an insulating material.

"Method of operating an inspection system" represents an operation sequence of the inspection system. "Process of carrying in and loading the stage, on which the DUT and the diode are loaded" represents a process of moving the stage, on which the DUT and the diode are loaded, to a position of the test station. "Process of carrying in and fixing the DUT to a test station" represents a process of moving the DUT to the test station and fixing the DUT thereto so as to realize a state in which the probe can comes into contact with the DUT. "Process of bringing a probe into contact with the DUT" represents a process of bringing the DUT and the probe into contact with each other to be electrically connected. "Process of switching a position of the diode" represents a process of mechanically moving the diode by using an electromagnetic solenoid and the like. "Process of performing a measurement with respect to the DUT" represents a process of acquiring characteristics of the DUT. "Process of carrying out the DUT from the stage" represents a process of extracting the DUT from the stage. "Process of classifying the DUT" represents a process of classifying the DUT in accordance with a difference in characteristics.

Figure 2:
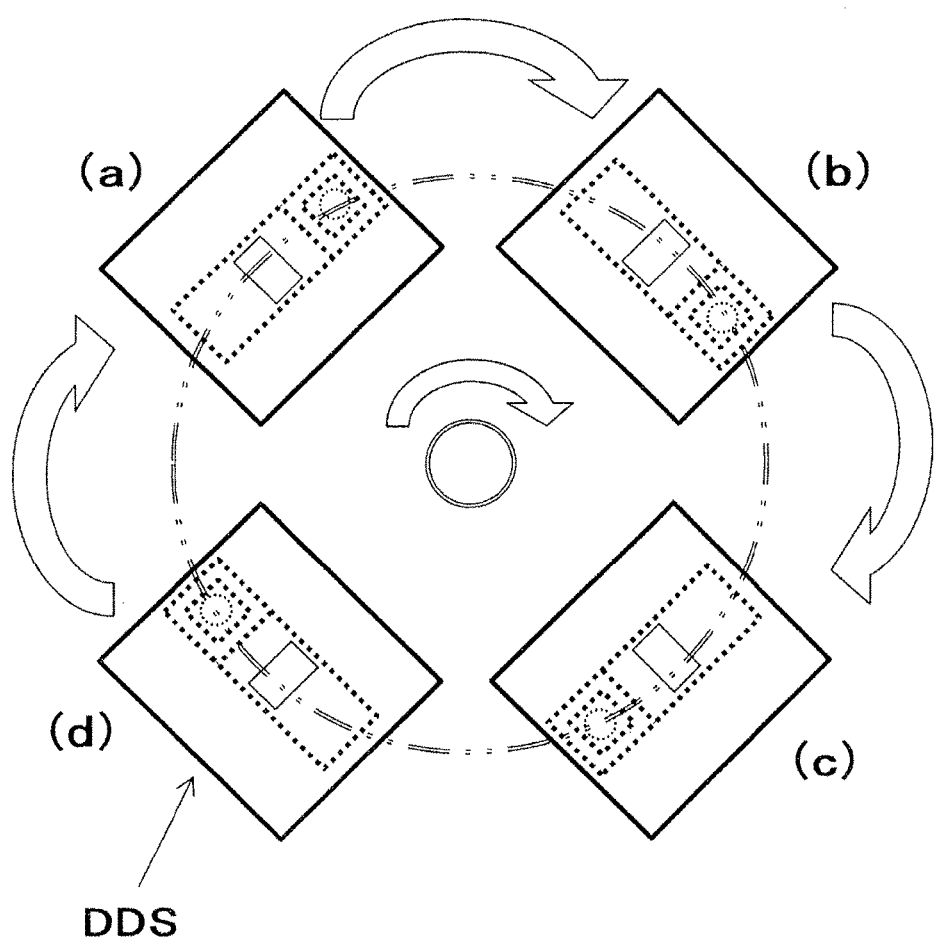
FIG. 2 is an example of a block diagram illustrating a rotary type system configuration of the bear chip inspection system according to the embodiment.

Hereinafter, an embodiment will be described with reference to the accompanying drawings. FIG. 1 is a block diagram illustrating a straight advancing type system configuration of a bear chip inspection system of this embodiment. FIG. 2 is a block diagram illustrating a rotary type system configuration of the bear chip inspection system of this embodiment. System configurations in FIG. 1(A) and FIG. 1(B) are straight advancing types in which a stage (DDS), on which a DUT and a diode are loaded, are allowed to advance straight to a carrying-in and loading station (a), a static characteristic test station (b), a dynamic characteristic test station (c), and a transfer station (d) in this order, and inspection is performed in each of the test stations. That is, in FIG. 1(A) and FIG. 1(B), a movement mechanism allows the DDS to advance straight. In addition, in a returning process (e), the DUT is not loaded. The system configuration in FIG. 2 is a rotary type in which the DDS is rotated to reach the a carrying-in and loading station (a), a static characteristic test station (b), a dynamic characteristic test station (c), and a transfer station (d) in this order, and inspection is performed in each of the test stations. That is, in FIG. 2, the movement mechanism rotates and moves the DDS. In addition, the order of the static characteristic test station and the dynamic characteristic test station does not matter. In addition, the static characteristic test station or the dynamic characteristic test station may be set as a station which is divided for each test circuit. Here, the DDS is connected to various test circuits in each of the test stations to perform a test corresponding to an inspection item in each of the test stations, and then the DDS is moved to the subsequent station.

Figure 3:
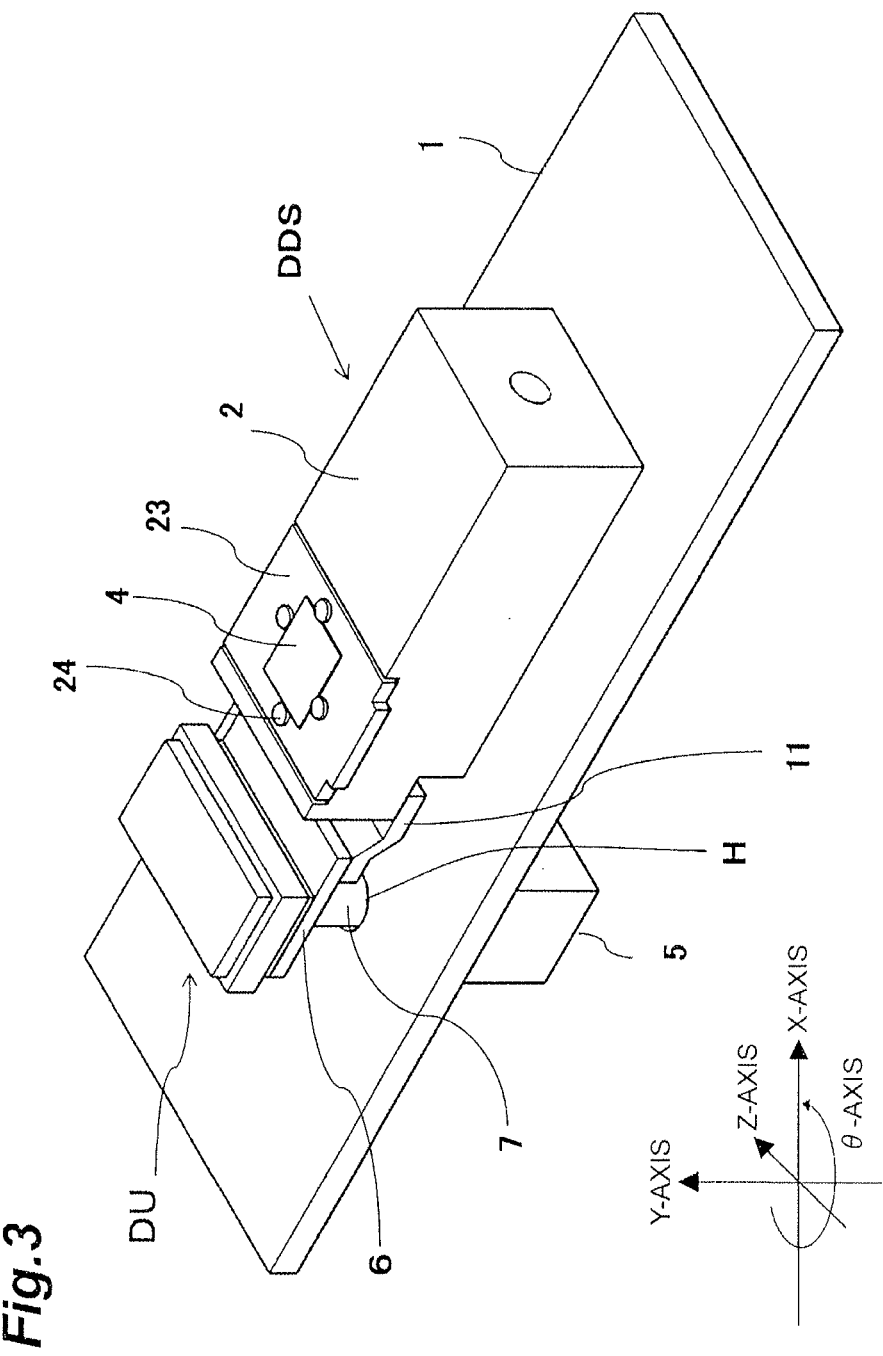
FIG. 3 is a perspective view illustrating a stage, on which a DUT and a diode are loaded, of the bear chip inspection system according to the embodiment.
Figure 4:
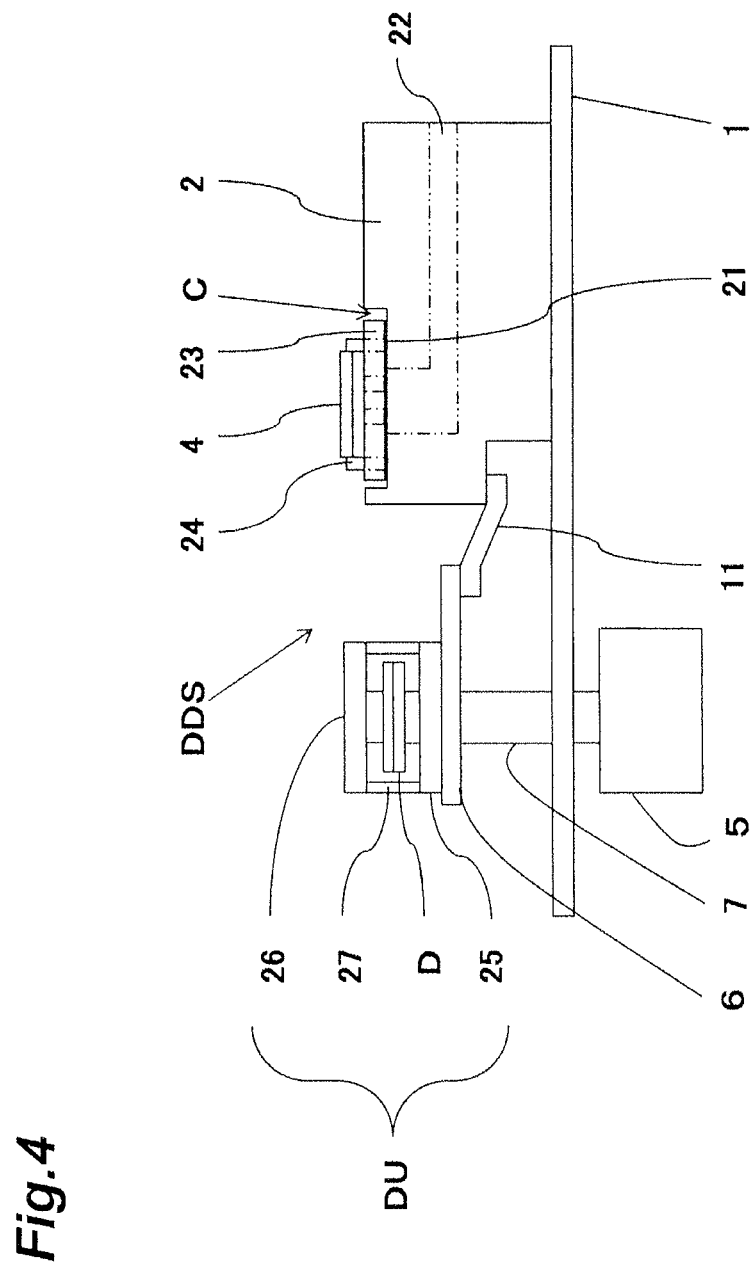
FIG. 4 is a side view illustrating the stage, on which the DUT and the diode are loaded, of the bear chip inspection system according to the embodiment.

FIG. 3 is a perspective view illustrating the DDS, on which a DUT and a diode D is loaded, of the bear chip inspection system of this embodiment. In addition, FIG. 4 is a schematic view illustrating a state in which DUT is loaded on the DDS, on which the DUT and the diode are loaded, of the bear chip inspection system of this embodiment. In FIG. 3 and FIG. 4, a DUT loading stage 2, which is a conductor also serving as an O electrode block, is loaded on the stage substrate 1. A concave portion C (processed groove) is formed in the DUT loading stage 2. In addition, a suction hole 22, which communicates with the bottom 21 of the DUT loading stage 2 from a lateral portion of the DUT loading stage 2, is provided in the bottom 21 of the concave portion C. In addition, the suction hole 22 is configured to communicate with a suction unit (not illustrated in the drawing). In addition, a DUT plate 23 is disposed on the bottom 21, and a DUT guide 24 is provided to the DUT plate 23 in order for a DUT 4 to be loaded on the DUT plate 23. For example, the DUT guide 24 is an insulating guide structure. In addition, the DUT plate 23 is configured to be exchangeable, and is exchanged with a new one when being abraded. On the other hand, an elevating mechanism 5 that moves up and down the diode D is provided on a lower side of the stage substrate 1. A through-hole H is formed in the stage substrate 1, and a rod 7 of the elevating mechanism 5 is moved up and down at the inside of the through-hole H. A diode unit DU is loaded on an upper end of the rod 7 through a diode substrate 6.

In FIG. 4, the DUT 4 such as a bear chip is loaded on the DDS in combination with the diode D. The diode D is protected by a case such as a resin case 27. The diode unit DU is loaded on the diode substrate 6 that is connected to the upper end of the rod 7. The diode unit DU includes an A electrode 25 that is a conductor, the diode D, and a K electrode 26 that is a conductor in this order from a lower side. The A electrode 25, the diode D, and the K electrode 26 are electrically connected to each other, and the periphery of the A electrode 25, the diode D, and the K electrode 26 is covered with the resin case 27. The electrode (the A electrode 25, the K electrode 26) portion is subjected to high-contact-reliability plating with a copper member excellent in conductivity or the like. In a portion that retains and protects the conductive member (the A electrode 25, the diode D, the K electrode 26), engineering plastic such as MC nylon, which is excellent in insulating properties, dimensional stability, and workability, is used. In addition, since a case such as the resin case 27 is used, the lifetime of the diode D is long, and the diode D can endure a plurality of times of tests.

As positioning means for positioning the DUT 4, for example, a method of using a positioning pin, or a method of moving the DDS is used. As a unit that detects the amount of movement of the DDS, for example, an image processing apparatus is used. For example, the image processing apparatus includes a CCD camera that captures an image of the DUT 4 from an upper side. In addition, for example, the DUT loading stage 2 and the diode substrate 6 are electrically connected to each other through a flexible cable 11 such as a flat wire. In addition, an upper surface of the DUT loading stage 2, an upper surface of the DUT 4, and an upper surface of the diode D may be located on a virtual plane in which the upper surfaces are flush with each other. According to this, a lower surface of a probe card K to be described later can be made to be horizontal, and thus it is possible to secure accurate contact. In addition, the shape, the size, and the arrangement of the DUT 4, the diode D, and the stage substrate 1, on which the DUT 4 and the diode D are loaded, may be appropriately changed in accordance with the kind of the DUT 4. That is, the DDS is a variable stage.

Figure 5:
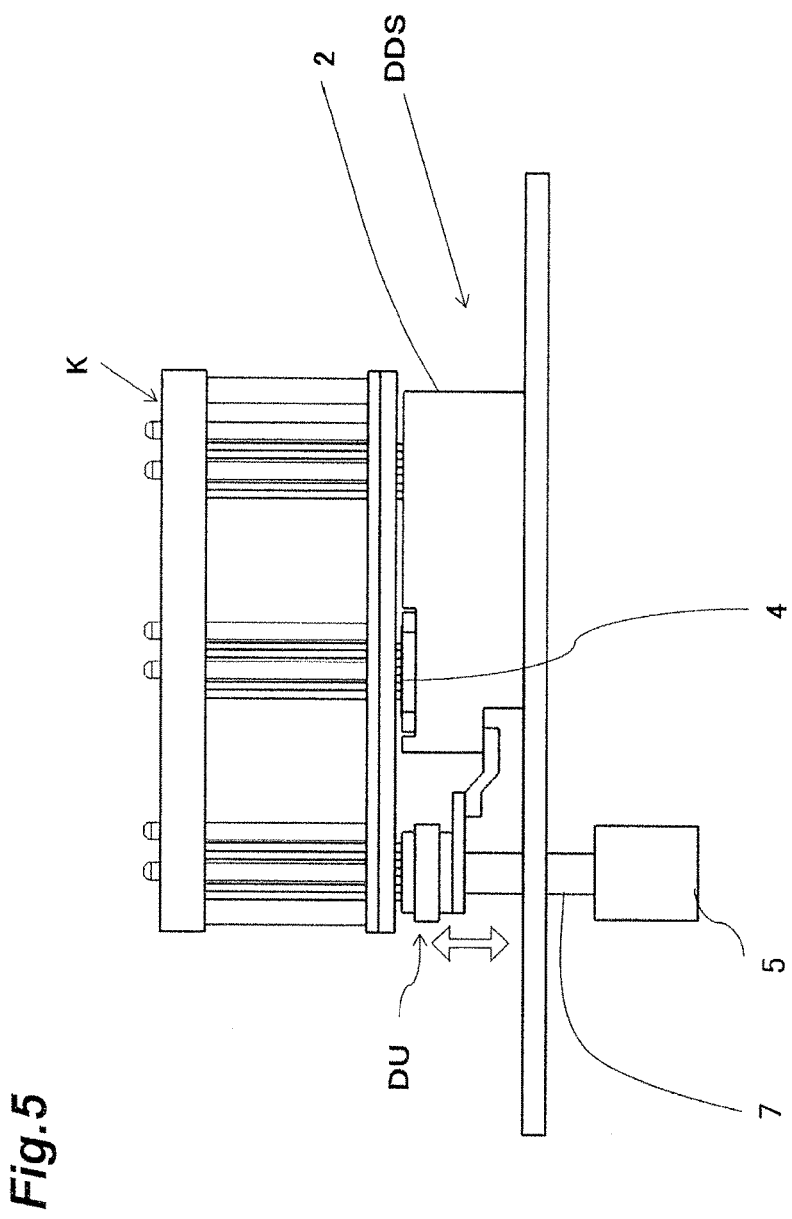
FIG. 5 is a schematic view illustrating a diode disconnection mechanism in the bear chip inspection system according to the embodiment, and illustrating a state in which the diode and a probe card are connected to each other.

FIG. 5 is a schematic view illustrating a diode D disconnection mechanism in the bear chip inspection system of this embodiment. FIG. 5 illustrates a state in which the diode D and the probe card K are connected to each other. In FIG. 5, in the DDS, the upper surface of the DUT 4, the upper surface of the DUT loading stage 2, and the upper surface of the diode D are electrically connected to each other through a wire probe P (refer to FIG. 10) of the probe card K that is located on an upper side. In the meantime, the upper surface of the diode D, the upper surface of the DUT loading stage 2, and the upper surface of the DUT 4 are located on a virtual plane, in which the upper surfaces are flush with each other, by the elevating mechanism 5. According to this, the lower surface of the probe card K can be made to be horizontal, and thus it is possible to secure accurate contact. In addition, the shape, the size, and the arrangement of the DUT 4 and the diode D can be appropriately changed in accordance with the kind of the DUT 4. The shape, the size, and the arrangement of the probe card K can also be appropriately changed, for example, in accordance with the DUT 4 to be inspected.

Figure 6:
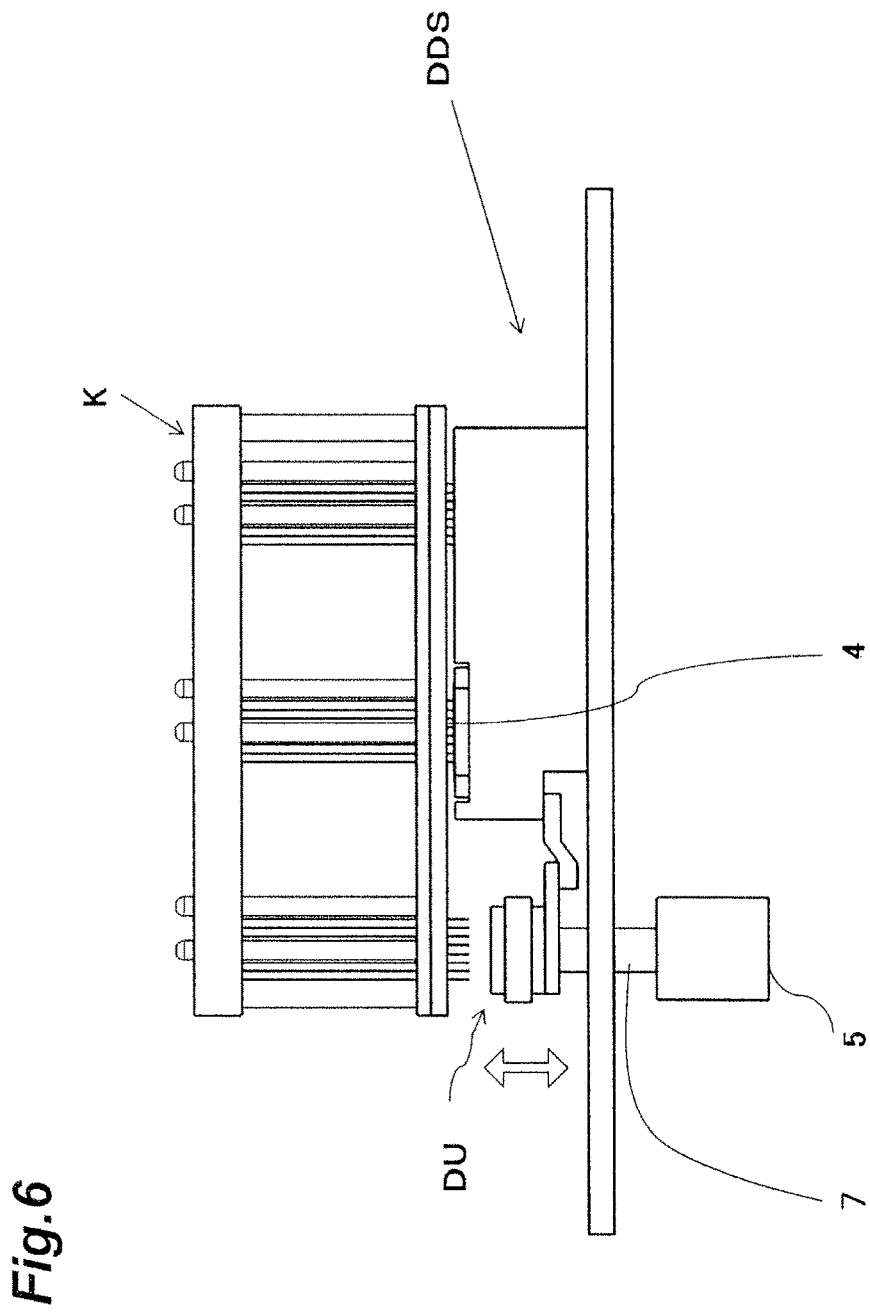
FIG. 6 is a schematic view illustrating the diode disconnection mechanism in the bear chip inspection system according to the embodiment, and illustrating a state in which the diode and a probe card are disconnected from each other.

FIG. 6 is a schematic view illustrating the diode disconnection mechanism in the bear chip inspection system of this embodiment. FIG. 6 illustrates a state in which the diode D and the probe card K are spaced away from each other. In FIG. 6, the rod 7 is moved down to a lower side by the elevating mechanism 5, and the upper surface of the diode D and a lower end of the probe card K are separated from each other. In addition, in the meantime, the upper surface of the DUT loading stage 2 and the upper surface of the DUT 4 are located on a virtual plane in which the upper surfaces are flush with each other.

Figure 7:
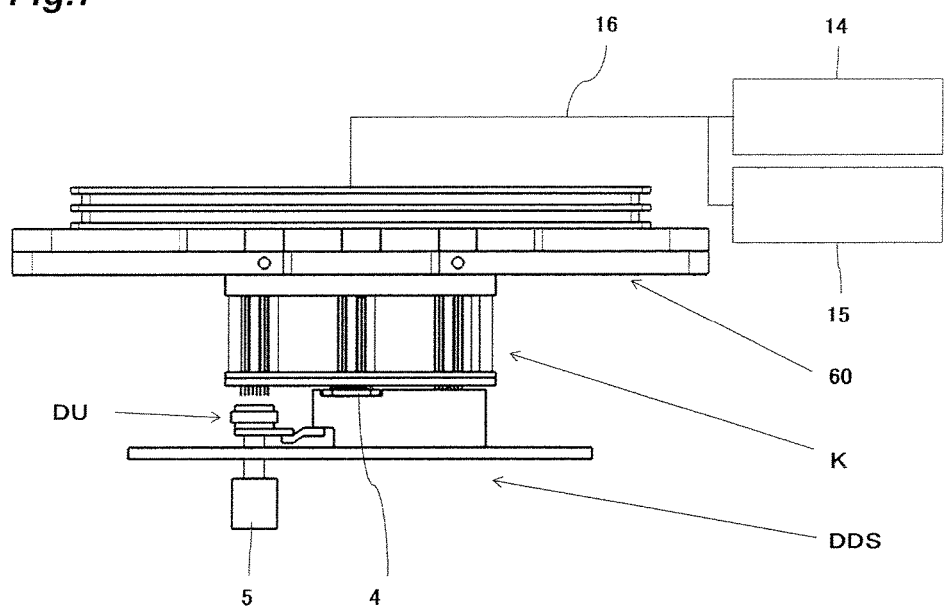
FIG. 7 is a schematic view illustrating a configuration in a static characteristic test station of the bear chip inspection system according to the embodiment.

FIG. 7 is a schematic view illustrating a configuration in the static characteristic test station of the bear chip inspection system of this embodiment. FIG. 7 illustrates a state in which the diode D and the probe card K are separated from each other. In FIG. 7, a lower surface of a probe holder 60 is capable of being electrically connected to an upper surface of the probe card K. In addition, the probe holder 60 is electrically connected to a static characteristic test unit 14 and a thermal resistance test unit 15 through an electric wire 16. The static characteristic test unit 14, the thermal resistance test unit 15, and the electric wire 16 correspond to a first test circuit of the static characteristic test station.

Figure 8:
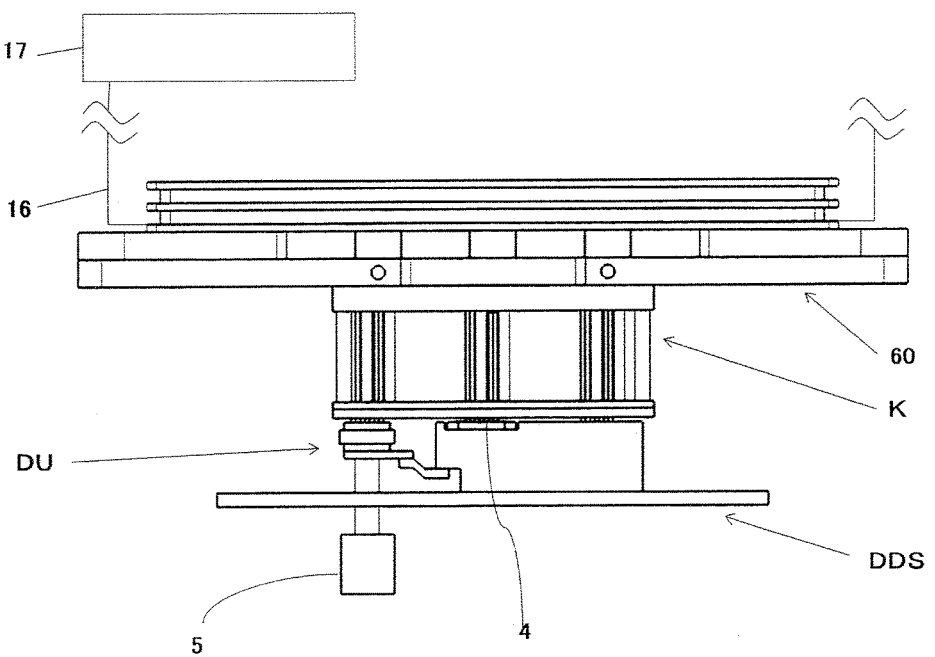
FIG. 8 is a schematic view illustrating a configuration in a dynamic characteristic test station of the bear chip inspection system according to the embodiment.

FIG. 8 is a schematic view illustrating a configuration in a dynamic characteristic test station of the bear chip inspection system according to the embodiment. In FIG. 8, a lower surface of the probe holder 60 is capable of being electrically connected to the upper surface of the probe card K. In addition, the probe holder 60 is electrically connected to a dynamic characteristic test unit 17 through an electric wire 16. The electric wire 16 and the dynamic characteristic test unit 17 correspond to a second test circuit of the dynamic characteristic test station.

Figure 9:
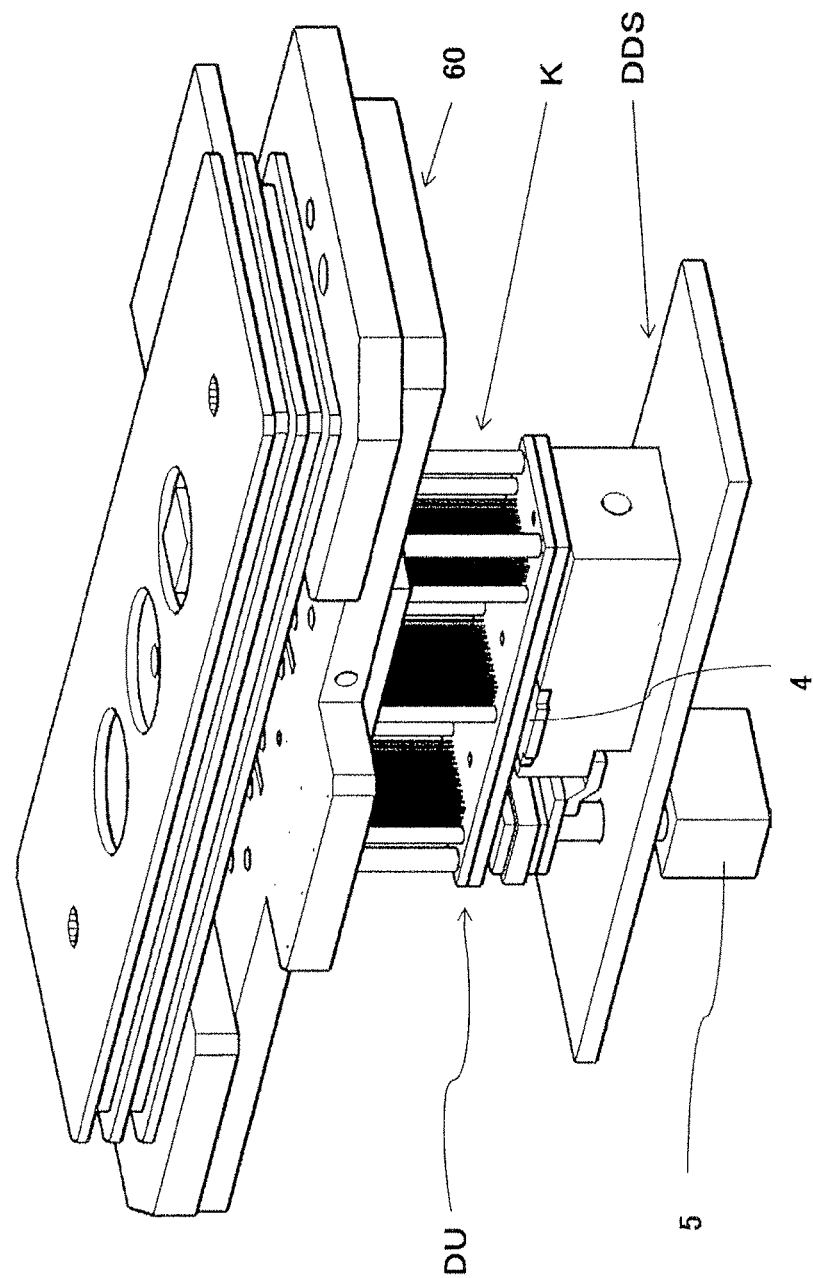
FIG. 9 is a perspective view illustrating a configuration in the dynamic characteristic test station of the bear chip inspection system according to the embodiment.

FIG. 9 is a perspective view illustrating the dynamic characteristic test station of the bear chip inspection system of this embodiment. FIG. 9 is a schematic perspective view of FIG. 8. Here, the probe holder 60 has a parallel flat plate structure. An upper surface of the probe holder 60 is capable of being connected to a dynamic characteristic measurement unit (not illustrated in the drawing).

Figure 10:
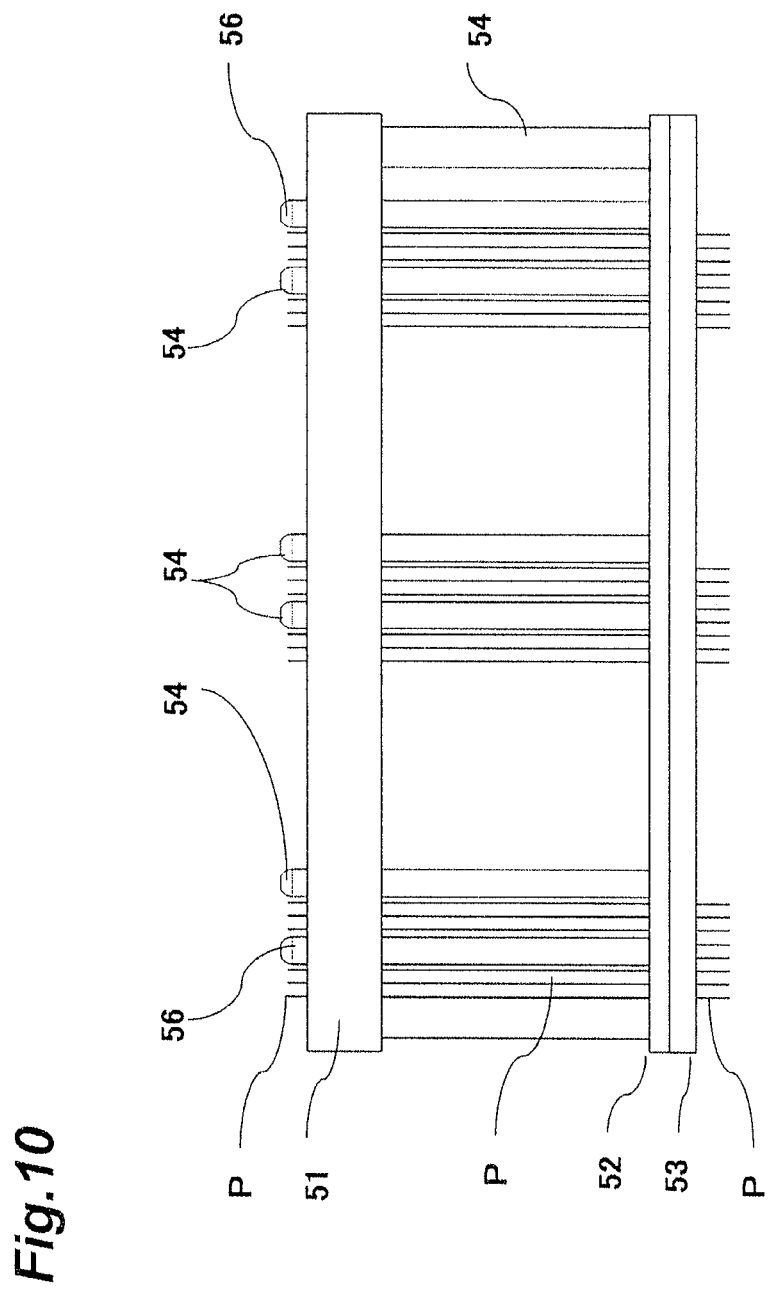
FIG. 10 is a schematic view illustrating the probe card of the bear chip inspection system according to the embodiment.

FIG. 10 is a schematic view illustrating the probe card K of the bear chip inspection system of this embodiment. In FIG. 10, an upper probe supporting member 51 is formed in a flat plate shape. The upper probe supporting member 51 is connected to lower probe supporting members 52 and 53 through a plurality of columns 54. The upper probe supporting member 51, and the lower probe supporting members 52 and 53 are parallel to each other. A plurality of wire probes P and a plurality of thin columns 56 are interposed between the upper probe supporting member 51, and the lower probe supporting members 52 and 53. A tip end of each of the wire probes P, and a tip end of each of the thin columns 56 protrude to an upper side of the upper probe supporting member 51. According to this configuration, the wire probe P can endure a pressing load by the DUT 4 from a lower side. In addition, contact between the wire probe P and the probe holder 60 is secured, and thus there is an advantage that positioning of the wire probe P can be accurately performed. In addition, as the probe card K, a dedicated one is appropriately designed in accordance with the kind of the DUT 4, specifications thereof, and the like. In addition, the position of the wire probe P is appropriately changed.

Figure 11:
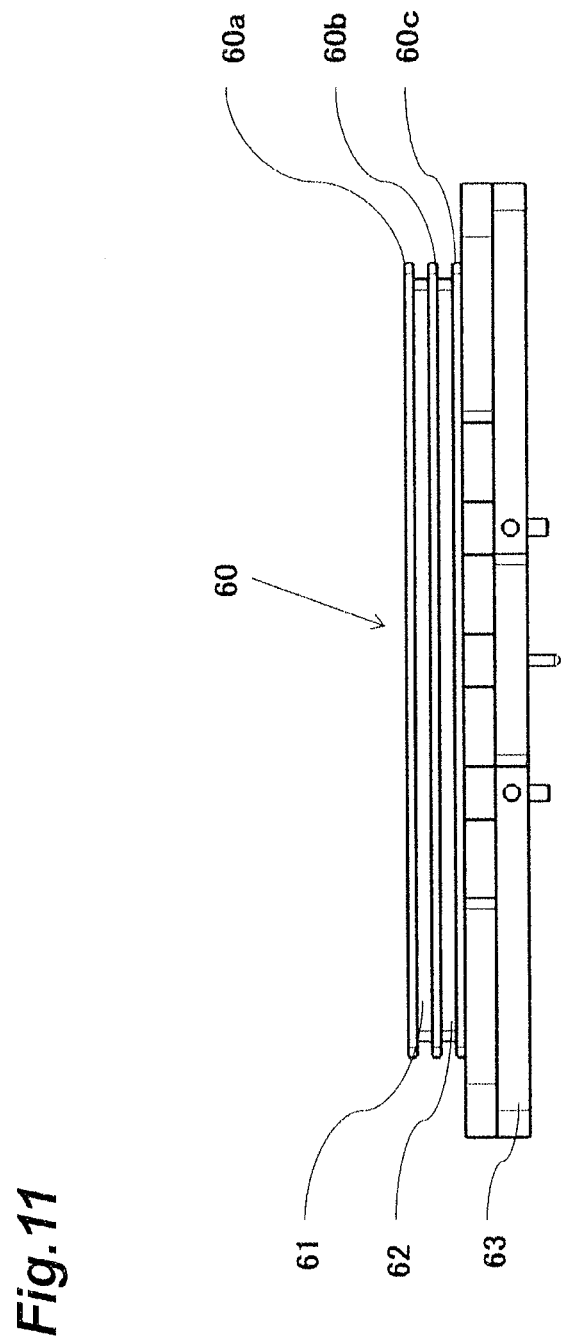
FIG. 11 is a schematic view illustrating a probe holder of the bear chip inspection system according to the embodiment.

FIG. 11 is a schematic view illustrating the probe holder 60 of the bear chip inspection system of this embodiment. The probe holder 60 is used when the diode D and the probe card K are connected to each other. The probe holder 60 includes a first insulating body 60a, an N electrode 61, a second insulating body 60b, a P electrode 62, and a third insulating body 60c. The first insulating body 60a, the N electrode 61, the second insulating body 60b, the P electrode 62, and the third insulating body 60c are stacked in this order from an upper side. In addition, a probe supporting member 63 is connected to a lower surface of the third insulating body 60c. As described above, since the probe holder 60 has a parallel flat plate structure, magnetic fields are cancelled, and thus inductance is reduced. As a result, it is possible to realize measurement with high accuracy. Here, the insulating bodies 60a to 60c are provided to prevent contact and discharging between electrodes. For example, when using insulating paper excellent in insulating properties, the insulating bodies 60a to 60c may be made to be thin. As a gap between the P electrode 62 and the N electrode 61 is narrower, an effect of cancelling "magnetic field due to a current" (hereinafter, referred to as an electromagnetic induction) becomes greater, and inductance becomes smaller. On the other hand, the insulating bodies 60a to 60c may be set to be greater than the electrodes when seen in a plan view. As described above, when the insulating bodies 60a to 60c are enlarged, a creeping distance is lengthened, and thus it is possible to prevent discharging in a more effective manner. In addition, the P electrode 62 and the N electrode 61 may be set to have the same shape. In this case, when reciprocating a current path between the P electrode 62 and the N electrode 61, it is possible to cancel electromagnetic induction, and thus it is possible to cancel magnetic fields. As a result, inductance is reduced.

Figure 12:
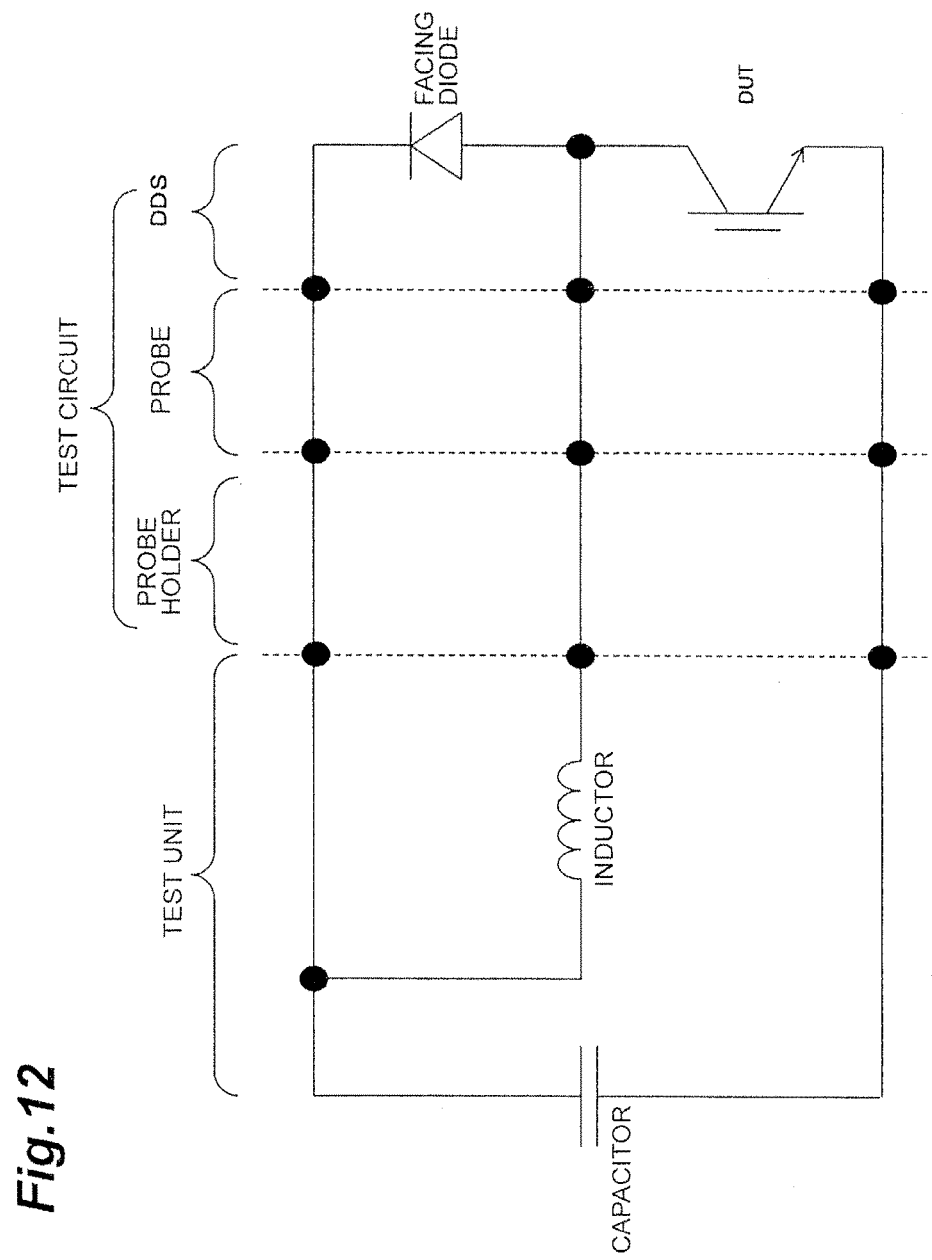
FIG. 12 is a schematic view illustrating a measurement equivalent circuit of the bear chip inspection system according to the embodiment.
Figure 13:
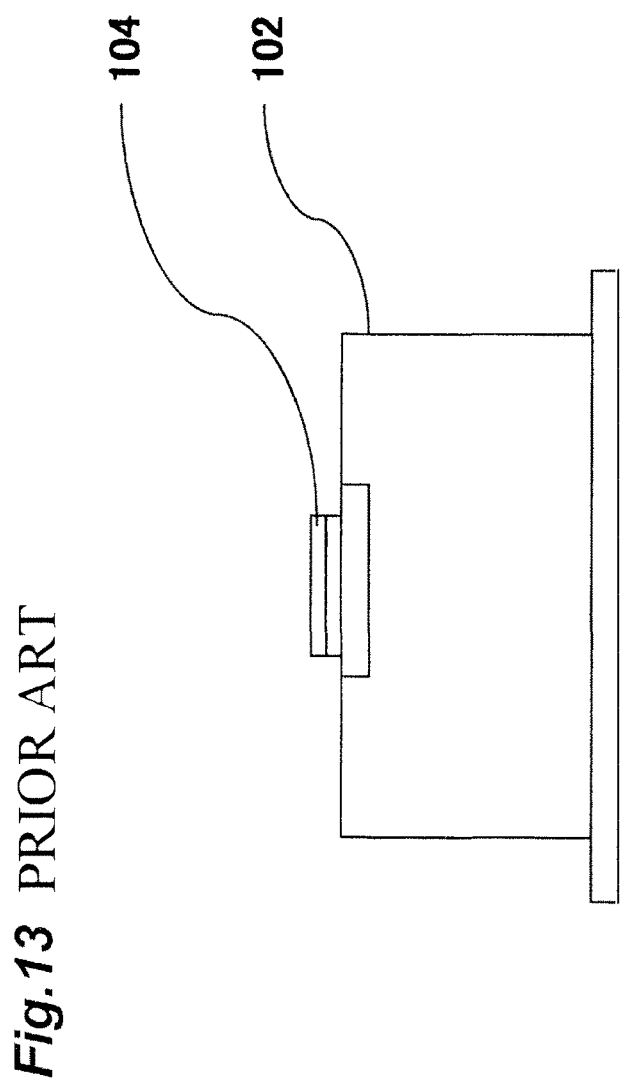
FIG. 13 is a schematic view illustrating a state in which a DUT is loaded on a stage in a bear chip inspection system of the related art.

FIG. 12 is a schematic view illustrating a measurement equivalent circuit of the bear chip inspection system of this embodiment. As illustrated in FIG. 12, when the diode is disposed at a position immediately close an electrode of the DUT, inductance is reduced. Here, each of the test circuits represents a circuit that is constituted by the probe holder, the probe, and the DDS, and for example, a test unit is excluded. The test unit is a so-called measurement device. For example, the test unit includes a capacitor, a current sensor, a voltage sensor, and protective circuit during abnormality, and the like which are necessary for measurement.

Figure 14:
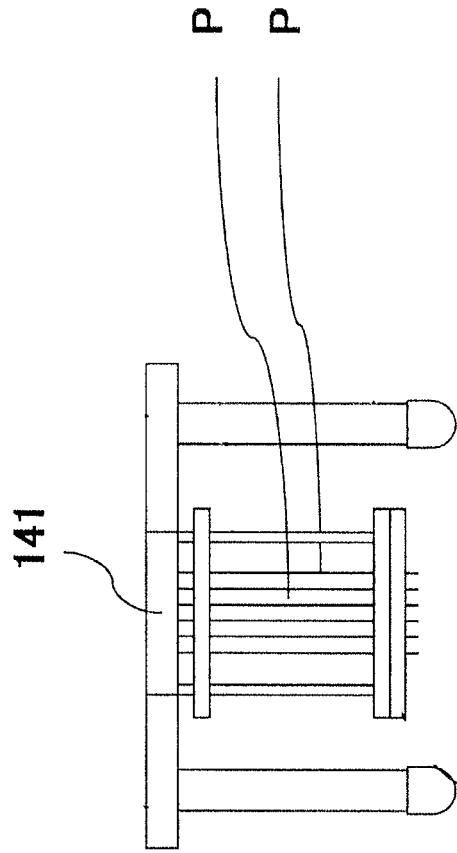
FIG. 14 is a schematic view illustrating a probe card of the bear chip inspection system of the related art.

FIG. 14 is a schematic view illustrating a probe card of a bear chip inspection system of the related art. In FIG. 14, a tip end of a wire probe P is connected to an N electrode, and the N electrode is connected to an O electrode on right and left ends thereof. In addition, the O electrode is connected to a thin column 141. Here, since a diode is not necessary, the bear chip inspection system of the related art has a characteristic in which a configuration is simple, but there is a disadvantage that inductance is great.

Figure 15:
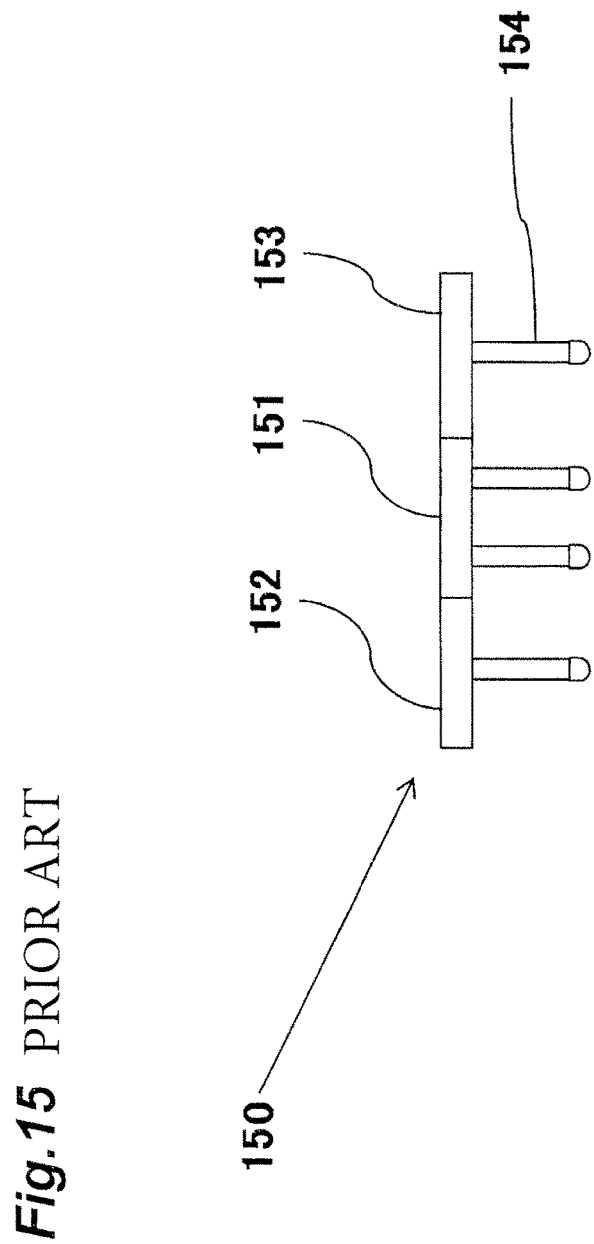
FIG. 15 is schematic view illustrating a probe holder of the bear chip inspection system of the related art.

FIG. 15 is a schematic view illustrating a probe holder of the bear chip inspection system of the related art. A probe holder 150 in FIG. 15 is the same as the probe holder 60 of this embodiment in that O electrodes 152 and 153 are respectively connected to right and left ends of an N electrode 151. However, the probe holder 150 is different from the probe holder 60 in that the wire probe P is not used. When using a spring probe 154 instead of the wire probe P, there is an advantage that connection with the O electrodes is simply established. However, even in this case, there is a disadvantage that inductance is great. In contrast, in the probe holder 60 of this embodiment, the problem relating to great inductance is solved, and thus it is possible to inspect device characteristics with accuracy. In addition, in the bear chip inspection system of this embodiment, the DDS, on which the DUT 4 and the diode D are loaded, is moved to the static characteristic test station and the dynamic characteristic test station, and is connected to each of the test circuits so as to inspect the device characteristics in an effective manner. In addition, in this embodiment, the probe holder 60 has a parallel flat plate structure. According to this configuration, it is possible to minimize an interconnection, and thus inductance is reduced. As a result, it is possible to realize measurement with high accuracy. In addition, the probe holder 60 receives the wire probe P on an electrode surface, and thus even when a position of the wire probe P varies depending on the DUT, it is not necessary to change the probe holder. As described above, in this embodiment, it is possible to further raise efficiency and accuracy.

Figure 16:
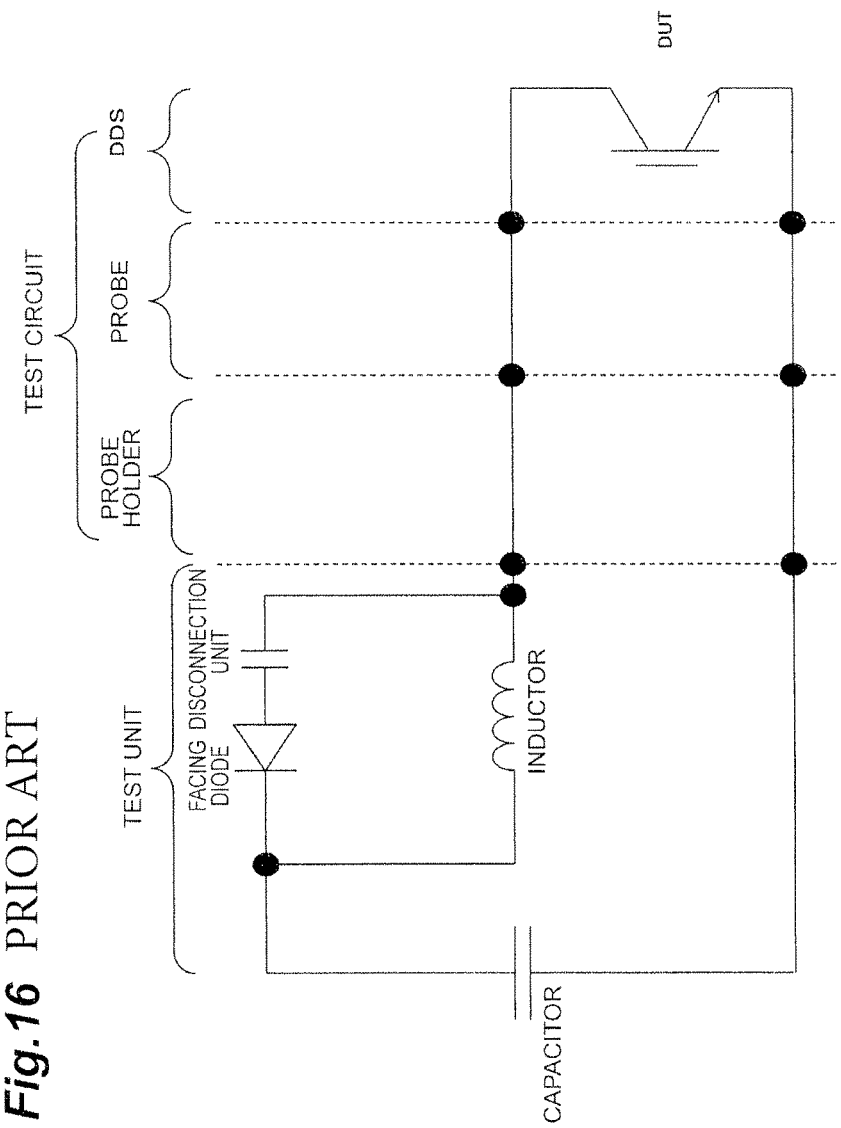
FIG. 16 is a schematic view illustrating a measurement circuit of the bear chip inspection system of the related art.

FIG. 16 is a schematic view illustrating a measurement circuit of the bear chip inspection system of the related art. In FIG. 16, a position, at which the DUT is provided, is far away from the diode, and thus an interconnection that connects the DUT and the diode is long. In addition, in FIG. 16, a disconnection unit, which releases connection between the DUT and the diode, is necessary. Accordingly, inductance, which is present in a component such as the interconnection and the disconnection unit, is added, and thus there is a problem that inductance is great.

Hereinafter, description will be given of an operation when using the configuration of this embodiment with reference to Example 1 and Example 2. Example 1 and Example 2 illustrate a method of operating the bear chip inspection system according to this embodiment.

EXAMPLE 1

First, a preliminary preparation is necessary. The size and kind of the DUT are different depending on the purpose, and the purpose of inspection is also different. Accordingly, the stage (DDS) as a variable unit, and the probe card are prepared in advance before inspection in accordance with the size, the kind, and the specifications of the DUT, and the purpose of inspection.

On the other hand, each of a test unit and a test circuit which are used is different in each case in accordance with the purpose of inspection. Here, the test unit and the test circuit, which are used in accordance with inspection, can be selected by changing the stage, on which the DUT and the diode are loaded, and the probe card in accordance with the DUT.

In addition, the probe holder can be selectively connected to the test unit and the test circuit through the stage and the probe card. The probe holder receives the wire probe P on an electrode surface. Accordingly, even when the position of the wire probe P varies depending on the DUT, typically, it is not necessary to change the probe holder. The probe holder is prepared in advance. Accordingly, the probe holder may also be called a "fixing unit" when considering that it is not necessary to change the probe holder.

When changing only a variable unit as described, it is possible to cope with a various kinds of DUTs (in various dimensions, electrode layouts, voltages, or currents). Next, for example, as illustrated in FIG. 1, the DDS, on which the DUT and the diode are loaded, is carried in and loaded. In addition, the DDS is carried in and fixed to the test station. Then, the DDS is transported to the static characteristic test station, in which the static characteristic test is performed, by the movement mechanism. Here, the first test circuit as illustrated in FIG. 7 is formed. The static characteristic test is performed in the first test circuit, and then formation of the first test circuit is released.

Then, the DDS is transported to the dynamic characteristic test station, in which the dynamic characteristic test is performed, by the movement mechanism. Here, the second test circuit as illustrated in FIG. 8 is formed, and the dynamic characteristic test is performed in the second test circuit.

Then, formation of the second test circuit is released. Next, the DDS is transported to the transfer station by the movement mechanism. In the meantime, the DUT is removed from the DDS, and then, the DDS is transported to the transfer station by the movement mechanism. In this manner, the DUT is carried out from the stage.

Meanwhile, as illustrated with reference to FIG. 5, a position of the diode is switched to perform inspection in conformity to a characteristic as necessary. On the other hand, a probe contact process may be performed in a period of time immediately before measurement.

The above-described processes are repeated. In addition, in a case where characteristics of a target to be measured are not included in a specification range, the target to be measured is classified and excluded from normal processes.

EXAMPLE 2

As a preliminary preparation, the stage as a variable unit, and the probe card are prepared in advance in accordance with the size or the kind, and the specifications of the DUT, or the purpose of inspection. In addition, the test unit and the test circuit, which are used in accordance with inspection, can be selected by changing the stage and the probe card in accordance with the DUT. In addition, the probe holder is prepared in advance. Then, the DDS in FIG. 2, on which the DUT and the diode are loaded, is carried in and loaded. In addition, the DDS is carried in and fixed to the test station. Then, the DDS is transported to the static characteristic test station in which the static characteristic test is performed by the movement mechanism. The subsequent test is the same as in Example 1, and description thereof will not be repeated.

As is clear from the above description, for example, the apparatus and the system of this embodiment are employed in a case where DUT inspection efficiency based on a total inspection is required. The purpose of using the DUT does not matter. In addition, in this embodiment, the bear chip inspection system is realized by a combination of the fixed unit and the variable unit. Accordingly, a DUT transporting unit can be selected from limited types, and thus design becomes simple.

In addition, it is possible to sufficiently utilize flexibility of the DDS by changing only the design of the DDS and the probe, and it is possible to cope with various tests. In addition, the system of this embodiment has a simple system structure, and thus it is possible to suppress an increase in system construction cost.

In addition, the operation method of this embodiment is a method of operating the bear chip inspection system of this embodiment. The operation method includes a process of carrying in and loading the stage on which the DUT and the diode are loaded, a process of carrying in and fixing the DUT to the test station, a probe contact process, a process of switching a position of the diode, a measurement process, a process of carrying out the DUT from the stage, and a classification process. Accordingly, it is possible to attain mechanical and electrical flexibility of the stage on which the DUT and the diode are loaded, and thus it is possible to perform various kinds of inspection with a simple operation.

As described above, in this embodiment, the system structure is simple, and thus the system construction cost is low.

Hereinbefore, an embodiment and a modification example have been described. However, the invention is not limited thereto, and various modifications can be made in a range not departing from the gist of the invention. For example, the probe holder is not limited to the probe holder 60 illustrated in FIG. 11, and the number of sheets, the shape, and the size of the electrode or the insulating body may be appropriately changed.

INDUSTRIAL APPLICABILITY

The inspection system for a device to be tested according to an aspect of the invention is preferable for inspection of an elementary device of a power semiconductor, and particularly, for inspection of an in-vehicle semiconductor device, but the usage of the inspection system does not matter.

In addition, the DUT varies in accordance with technical advance. However, according to an aspect of the invention, there is an advantage that even when the DUT varies, it is not necessary to design and manufacture the probe holder again, and typically, the probe holder can be used as is.

REFERENCE SIGNS LIST

1: Stage substrate (DDS: stage on which DUT and diode are loaded)
4: DUT (device to be tested)
5: Elevating mechanism (separation mechanism, and connection and separation mechanism)
6: Diode loading stage (diode substrate)
11: Flexible cable (separation mechanism, connection and separation mechanism)
14: Static characteristic test unit (first test circuit)
15: Thermal resistance test unit (first test circuit)
16: Electric wire (first test circuit, second test circuit)
17: Dynamic characteristic test unit (second test circuit)
22: Suction hole
60: Probe holder
61: N electrode
62: P electrode
C: Concave portion (processed groove)
D: Diode
K: Probe card (probe)
a: Carrying-in loading station
b: Static characteristic test station
c: Dynamic characteristic test station
d: Transfer station

The invention claimed is:

1. An inspection system for a device to be tested, comprising:
a diode that is loaded in parallel to the device to be tested, and is capable of being connected to a test circuit;
a stage on which the device to be tested and the diode are loaded; and
a movement mechanism that moves the stage to a static characteristic test station including a first test circuit that measures static characteristics of the device to be tested, and a dynamic characteristic test station including a second test circuit that measures dynamic characteristics of the device to be tested.

2. The inspection system for a device to be tested according to claim 1, further comprising:
an elevating mechanism that moves up and down the diode with respect to the stage,
wherein the diode is capable of being connected to or separated from the first test circuit and the second test circuit by the elevating mechanism.

3. The inspection system for a device to be tested according to claim 1,
wherein the stage, on which the device to be tested and the diode are loaded, connects the diode to the first test circuit by pushing up the diode to come into contact with a probe, which is provided to the first test circuit, in the static characteristic test station.

4. The inspection system for a device to be tested according to claim 1,
wherein the stage, on which the device to be tested and the diode are loaded, separates the diode from the first test circuit by lowering the diode to be separated from a probe, which is provided to the first test circuit, in the static characteristic test station.

5. The inspection system for a device to be tested according to claim 4,
wherein the stage, on which the device to be tested and the diode are loaded, is provided with a separation mechanism that separates the diode from the first test circuit by lowering the diode to be separated from the probe in the static characteristic test station, and
the separation mechanism includes an elevating mechanism that is connected to a lower portion of the diode loading stage, and a flexible cable that electrically connects the diode and the device to be tested.

6. The inspection system for a device to be tested according to claim 4,
wherein the stage, on which the device to be tested and the diode are loaded, is provided with a connection and separation mechanism that connects or separates the diode to or from the first test circuit in accordance with whether or not the probe and the diode come into contact with each other in the static characteristic test station, and
the connection and separation mechanism includes an elevating mechanism that is connected to a lower portion of the diode loading stage, and a flexible cable that electrically connects the diode and the device to be tested.

7. The inspection system for a device to be tested according to claim 1,
wherein the stage, on which the device to be tested and the diode are loaded, separates the diode from the second test circuit by lowering the diode to be separated from a probe, which is provided to the second test circuit, in the dynamic characteristic test station.

8. The inspection system for a device to be tested according to claim 1,
wherein a probe, a probe holder, a dynamic characteristic test circuit, and a dynamic characteristic test unit which are provided to the second test circuit are connected to each other in the dynamic characteristic test station.

9. The inspection system for a device to be tested according to claim 8,
wherein the probe, the probe holder, the dynamic characteristic test circuit, and the dynamic characteristic test unit are connected to each other in the dynamic characteristic test station, and
the probe holder has a parallel flat plate structure in which a P electrode and an N electrode are stacked.

10. The inspection system for a device to be tested according to claim 1,
wherein the movement mechanism moves the stage, on which the device to be tested and the diode are loaded, to a transfer station that transfers the device to be tested.

11. The inspection system for a device to be tested according to claim 10,
wherein the stage, on which the device to be tested and the diode are loaded, is moved to the static characteristic test station, the dynamic characteristic test station, and the transfer station in this order.

12. The inspection system for a device to be tested according to claim 1,
wherein the stage, on which the device to be tested and the diode are loaded, is provided with a suction and fixing unit that suctions and fixes the device to be tested to the stage.

13. The inspection system for a device to be tested according to claim 1,
wherein the stage, on which the device to be tested and the diode are loaded, is provided with a suction and fixing unit suction and fixed the device to be tested to the stage, and a position unit that performs alignment of the device to be tested by using an image processing apparatus, and a probe comes into contact with an electrode of the device to be tested.

14. The inspection system for a device to be tested according to claim 1, wherein the stage, on which the device to be tested and the diode are loaded, is provided with a suction and fixing unit having a suction hole for suction and fixing of the device to be tested to the stage, and a positioning unit that positions the device to be tested to a predetermined position by using an insulating guide structure, and a probe comes into contact with an electrode of the device to be tested.

15. The inspection system for a device to be tested according to claim 14, wherein the movement mechanism moves the stage, on which the device to be tested and the diode are loaded, while controlling the stage in XYZθ directions so as to bring the probe into contact with a predetermined electrode of the device to be tested.

16. The inspection system for a device to be tested according to claim 1, wherein the stage, on which the device to be tested and the diode are loaded, is provided with a positioning unit having a processed groove in which the device to be tested is fixed, and a probe comes into contact with an electrode of the device to be tested.

17. A method for operating an inspection system for a device to be tested, the method being used in the inspection system for the device to be tested in which a stage, on which a device to be tested and a diode are loaded, is moved to a static characteristic test station and a dynamic characteristic test station, and the method comprising:

a process of carrying in and loading the stage, on which the device to be tested and the diode are loaded;

a process of carrying in and fixing the device to be tested to a test station;

a process of bringing a probe into contact with the diode;

a process of switching a position of the diode;

a process of performing a measurement with respect to the device to be tested;

a process of carrying out the device to be tested from the stage; and a process of classifying the device to be tested.

18. The method for operating an inspection system for a device to be tested according to claim 17, wherein in the process of bringing the probe into contact with the diode, the device to be tested is suctioned and fixed to the stage by using a suction hole, and alignment is performed by an image processing apparatus in order for the probe to come into contact with an electrode of the device to be tested.

* * * * *